(12) United States Patent
Shimizu et al.

(10) Patent No.: US 7,297,981 B2
(45) Date of Patent: Nov. 20, 2007

(54) ELECTRO-OPTICAL DEVICE HAVING A LIGHT-SHIELDING FILM COMPRISING ALTERNATING LAYERS OF SILICIDE AND NITRIDED SILICIDE

(75) Inventors: Yuichi Shimizu, Hokuto (JP); Katsumi Asada, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/023,476

(22) Filed: Dec. 29, 2004

(65) Prior Publication Data

US 2005/0156170 A1 Jul. 21, 2005

(30) Foreign Application Priority Data

Jan. 19, 2004 (JP) .............................. 2004-010515

(51) Int. Cl.
G02F 1/1333 (2006.01)
H01L 29/786 (2006.01)

(52) U.S. Cl. .................. 257/72; 349/111; 257/E27.112

(58) Field of Classification Search .................. 257/98, 257/59, 72; 349/310, 311
See application file for complete search history.

(56) References Cited

U.S. PATENT DOCUMENTS

| | | | | |
|---|---|---|---|---|
| 5,759,878 | A * | 6/1998 | Hayashi et al. | 438/151 |
| 5,808,714 | A * | 9/1998 | Rowlands et al. | 349/110 |
| 6,157,426 | A | 12/2000 | Gu | |
| 7,167,221 | B2 * | 1/2007 | Yeh et al. | 349/110 |
| 2002/0036818 | A1 * | 3/2002 | Kawata | 359/254 |

FOREIGN PATENT DOCUMENTS

| | | | |
|---|---|---|---|
| CN | 1343905 A | | 4/2002 |
| JP | 02-027764 | * | 1/1990 |
| JP | 04-063349 | * | 2/1992 |
| JP | A-07-013146 | | 1/1995 |
| JP | 10-197713 | * | 7/1998 |
| JP | 2000-098407 A | | 4/2000 |
| JP | 2002-122888 | | 4/2002 |
| JP | 2004-347779 | * | 12/2004 |
| JP | 2005-202290 | * | 7/2005 |
| JP | 2005-203684 | * | 7/2005 |

OTHER PUBLICATIONS

English-Language abstract of JP 02-027764, Noguchi et al, Jan. 30, 1990.*
English-Language abstract of JP 2005-203684.*
English-Language abstract of JP 2005-202290.*
English-Language abstract of JP 2004-347779.*

* cited by examiner

Primary Examiner—Lynne Gurley
Assistant Examiner—Andrew O. Arena
(74) Attorney, Agent, or Firm—Oliff & Berridge, PLC (57) ABSTRACT

A light-shielding film formed above a substrate has a multilayered thin film structure, in which a thin film not containing nitrogen and a thin film containing nitrogen are alternately arranged. Since the thin film containing nitrogen is formed in the light-shielding film, the stress caused by thermal distortion at the time of an annealing treatment is absorbed by the thin film containing nitrogen. Thus, cracks in an insulating film or a semiconductor film which extend from the light-shielding film can be prevented from occurring.

9 Claims, 7 Drawing Sheets

ELECTRO-OPTICAL DEVICE HAVING A LIGHT-SHIELDING FILM COMPRISING ALTERNATING LAYERS OF SILICIDE AND NITRIDED SILICIDE

BACKGROUND

The present invention relates to an electro-optical device in which a light-shielding film is film-formed on a substrate in a multilayered structure by a sputtering method, a method of manufacturing the same, and an electronic apparatus.

Generally, in electro-optical devices, for example, liquid crystal devices which perform a predetermined display using a liquid crystal as an electro-optical material, the liquid crystal is held between a pair of substrates. Among them, in an electro-optical device, such as a liquid crystal device of an active matrix drive scheme based on a thin film transistor (TFT) drive, thin film diode (TFD) drive or the like, pixel electrodes and switching elements are provided at intersections of a plurality of scanning lines (gate lines) and a plurality of data lines (source lines), which are arranged in longitudinal and traverse directions, on a substrate (active matrix substrate).

A switching element such as a TFT element turns on by an ON signal supplied to the gate line and writes an image signal, which is supplied via a source line, to the pixel electrode (transparent electrode (ITO)). Thus, a voltage based on the image signal is applied to a liquid crystal layer between the pixel electrode and a counter electrode, thereby changing the arrangement states of liquid crystal molecules. In this way, the transmittance ratio of a pixel changes, light passing through the pixel electrode and the liquid crystal layer changes according to the image signal, thereby performing image display.

An element substrate constituting such a switching element is constructed by stacking a semiconductor layer film, an insulating film (interlayer insulating film), or a conductive film with a predetermined pattern on a glass or quartz substrate. That is, by repeatedly performing a film formation step and a photolithography step over various films, a TFT substrate or the like is formed.

In addition, light influences a TFT element such that the transistor characteristics of the TFT element changes. In particular, when the liquid crystal device is used as a light valve of a projection type display device, the intensity of incident light is very high, and thus it is important to shield a channel region or peripheral region of the TFT from the incident light. For this reason, a light-shielding film is formed to oppose the channel region or peripheral region of the TFT element, such that light is not radiated onto the channel region or peripheral region of the TFT element portion.

As a material of the light-shielding film, a metal silicide such as a non-transparent high melting point metal material or a high melting point metal compound is widely used.

In a manufacturing process, first, a conductive light-shielding film is film-formed on the entire surface of the TFT substrate by a sputtering method. Next, the light-shielding film is patterned by a photolithography method to form the light-shielding film with a predetermined pattern. And then, after an interlayer insulating film is film-formed to cover the light-shielding film, an annealing treatment is performed. Thereafter, a semiconductor layer is formed on the interlayer insulating film with a polysilicon film. Here, the annealing treatment is performed at a temperature of about 1000° C. for the planarization of the interlayer insulating film and for the contamination control of the semiconductor layer.

Further, when the light-shielding film is formed by film-forming the metal silicide, such as tungsten silicide (WSi), which is widely used as the material for the light-shielding film, by the sputtering method, at the time of the film formation, a metal single layer or amorphous layer of tungsten (W) and silicon (Si) has a high resistance value, and thus the metal single layer or amorphous layer is adversely affected from the annealing treatment to form a silicide layer which has a low resistance value.

However, when a crystalline structure of an alloy is constructed by the silicide reaction, the internal stress gradually increases. As a result, if the annealing treatment is performed in the state in which the light-shielding film (WSi), the interlayer insulating film (NSG), and, if required, the semiconductor layer (polysilicon) are deposited, when returning to room temperature after the treatment, a stress due to the thermal distortion between tungsten silicide (as the material for the light-shielding film) and NSG (as the material for the interlayer insulating film) or polysilicon (as the material for the semiconductor layer) occurs. Accordingly, cracks in the interlayer insulating film (NSG) extending from the light-shielding film are likely to be caused.

If the cracks in the interlayer insulating film is caused, the cracks spread to the peripheral region of the semiconductor layer or the like therefrom, which results in causing element defects such as electrical short or open. Therefore, the product yield is lowered.

As a countermeasure against the above-mentioned problems, a method in which the pattern of the light-shielding film is made to be small and narrow may be considered. In this case, however, light is likely to leak to the channel region or peripheral region of the TFT element portion, thus it has a little feasibility of being realized. Further, a method in which the film thickness of the light-shielding film is made to be thin may be considered. In this case, however, the sufficient light-shielding property cannot be obtained, and stepped portions with respect to other layers are likely to be caused due to the change in the film thickness.

SUMMARY

The present invention has been made in consideration of the above-mentioned problems, and it is an object of the present invention to provide an electro-optical device capable of reducing the stress caused by thermal distortion at the time of an annealing treatment with a high manufacturing yield and reliability, without lowering a light-shielding property of the light-shielding film and changing the film thickness, a method of manufacturing the electro-optical device, and an electronic apparatus.

In order to achieve the above-mentioned abject, an electro-optical device according to the present invention comprises a light-shielding film formed above a substrate, wherein the light-shielding film has a multilayered thin film structure formed by alternately arranging a silicide thin film containing an additional material and a silicide thin film not containing the additional material.

In such a configuration, the light-shielding film is the multilayered thin film structure in which the silicide thin film containing the additional material and the silicide thin film not containing the additional material are alternately arranged. Thus, the stress caused by thermal distortion at the time of an annealing treatment can be absorbed by the silicide thin film containing the additional material.

Further, a thin film formed as a lowermost layer of the light-shielding film may be made of the silicide thin film not containing the additional material.

In such a configuration, since the thin film formed as a lowermost layer of the light-shielding film is made of the silicide thin film not containing the additional material, the lowermost thin film has a low resistance value so as to be connected with other wiring lines.

Further, a thin film formed as a lowermost layer of the light-shielding film may be made of the silicide thin film containing the additional material.

In such a configuration, since the thin film formed as the lowermost layer of the light-shielding film is made of the silicide thin film containing the additional material, the lowermost thin film has a high resistance value.

Further, a thin film formed as an uppermost layer of the light-shielding film may be made of the silicide thin film not containing the additional material.

In such a configuration, since the thin film formed as the uppermost layer of the light-shielding film is made of the silicide thin film not containing the additional material, the uppermost thin film has a low resistance value so as to be connected with other wiring lines.

Further, a thin film formed as an uppermost layer of the light-shielding film may be made of the silicide thin film containing the additional material.

In such a configuration, since the thin film formed as the uppermost layer of the light-shielding film is made of the silicide thin film containing the additional material, the uppermost thin film has a high resistance value.

Further, the additional material may be made of at least one of nitrogen and a nitrogen-based compound.

In such a configuration, since the additional material is made of at least one of nitrogen and a nitrogen-based compound, a nitrogen gas can be supplied as a reactive gas when the light-shielding film is formed by a sputtering method.

Further, the silicide thin film may be a metal silicide film including a high melting point metal material or a high melting point metal compound.

In such a configuration, even when the respective silicide thin films constituting the light-shielding film is made of the metal silicide film including the high melting point metal material or high melting point metal compound, the silicide thin film containing the additional material is disposed in the light-shielding film, the thermal distortion caused by the annealing treatment can be absorbed.

Further, a semiconductor layer may be deposited on the light-shielding film with an insulating film interposed therebetween.

In such a configuration, since the thermal distortion generated at the time of the annealing treatment is controlled, the stress between the light-shielding film and the semiconductor layer deposited on the light-shielding film with the insulating film interposed therebetween is not caused, such that cracks can be prevented from occurring.

Further, a thin film transistor may be formed on the substrate, and the light-shielding film may be formed above the thin film transistor to cover at least the thin film transistor.

In such a configuration, since the thermal distortion generated at the time of the annealing treatment is controlled, the stress between the thin film transistor and the light-shielding film covering the thin film transistor is not caused, such that cracks can be prevented from occurring.

Further, there is provided a method of manufacturing an electro-optical device according to the present invention, in which a light-shielding film is film-formed by sputtering at least one kind of high melting point metal material as a target material onto a substrate set within a chamber. The method comprises a step of intermittently supplying a reactive gas as an additional material into the chamber such that a thin film not containing the additional material and a thin film containing the additional material are alternately formed in the light-shielding film.

In such a configuration, when the light-shielding film is film-formed by the sputtering method, the reactive gas is intermittently supplied such that the thin film not containing the additional material and the thin film containing the additional material are alternately film-formed. Thus, the light-shielding film having a multilayered structure can be film-formed at one time by the sputtering method.

Further, the reactive gas may be a nitrogen gas.

In such a configuration, since the nitrogen gas is used as the reactive gas, a metal silicide nitride film can be film-formed.

Further, after patterning the light-shielding film, an insulating film may be formed on the light-shielding film, and then an annealing treatment may be performed.

In such a configuration, since the thin film containing the additional material is disposed in the light-shielding film, the thermal distortion generated at the time of the annealing treatment can be absorbed. Therefore, cracks extending from the light-shielding film can be prevented occurring.

Further, an electronic apparatus according to the present invention comprises the above-mentioned electro-optical device.

In such a configuration, the electro-optical device which is mounted to the electronic apparatus does not cause cracks extending from an insulating film when an annealing treatment is performed to the insulating film formed on a substrate which is provided in the electronic apparatus. Therefore, the electronic apparatus to which the electro-optical device is mounted can have high reliability.

DETAILED DESCRIPTION OF EMBODIMENTS

Figure 1:
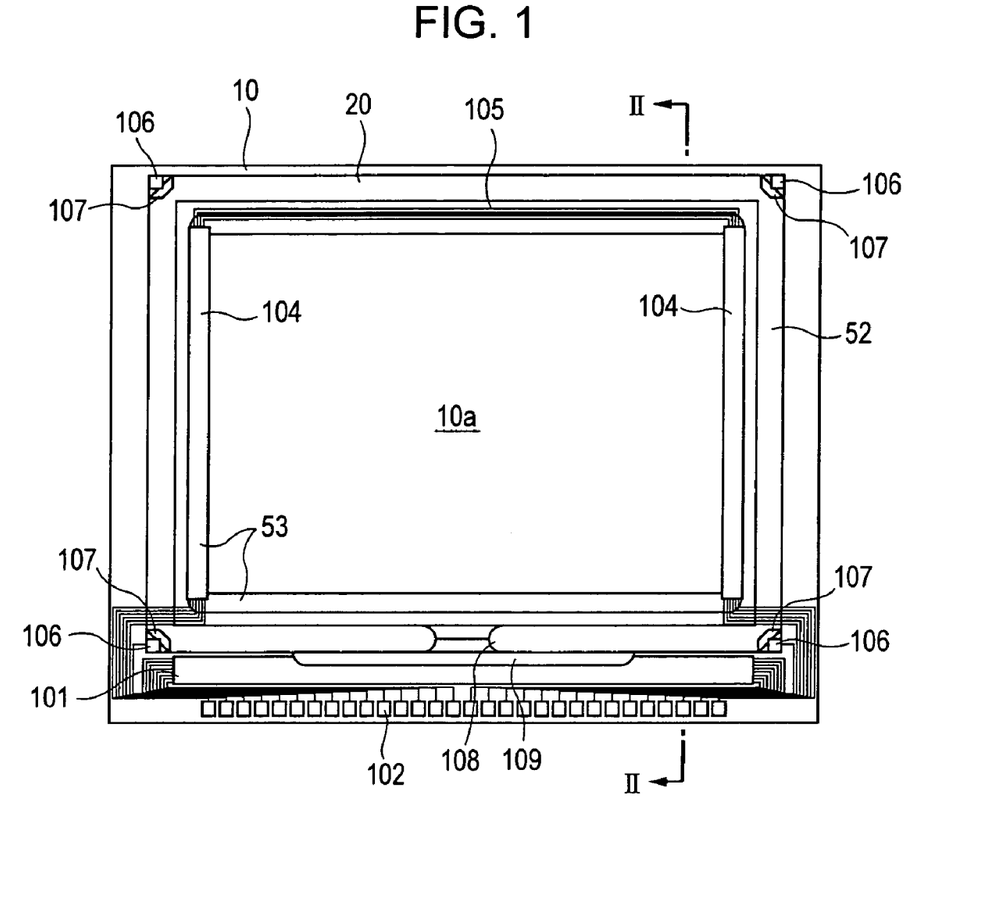
FIG. 1 is a plan view a liquid crystal device and various element formed thereon as viewed from a counter substrate.
Figure 2:
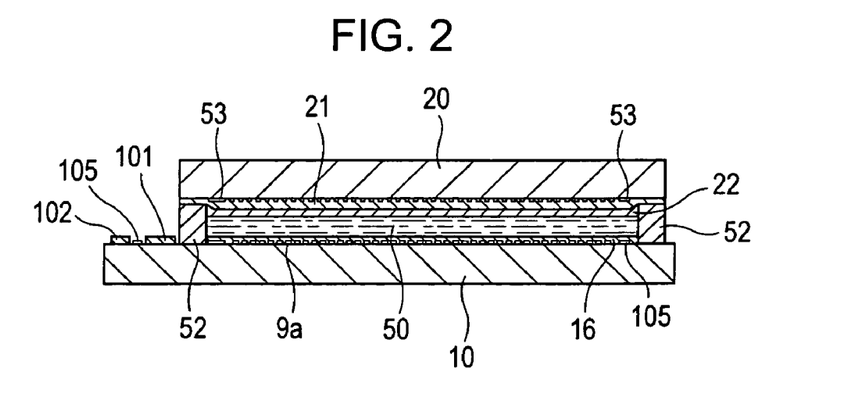
FIG. 2 is a cross-sectional view of a liquid crystal device taken along line II-II of FIG. 1 after an assemblage step in which an element substrate and a counter substrate are bonded and liquid crystal is sealed is completed.
Figure 3:
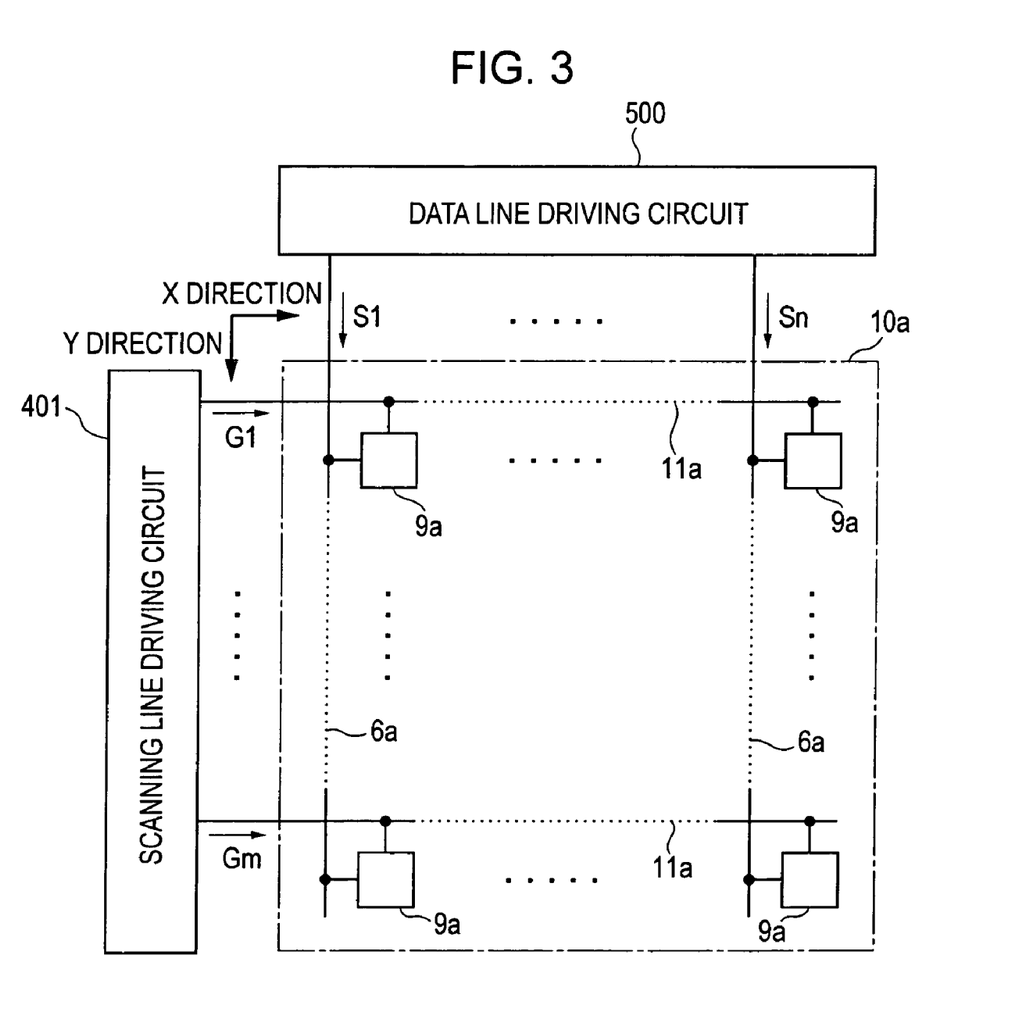
FIG. 3 is a block diagram showing an electrical configuration of a liquid crystal device.
Figure 4:
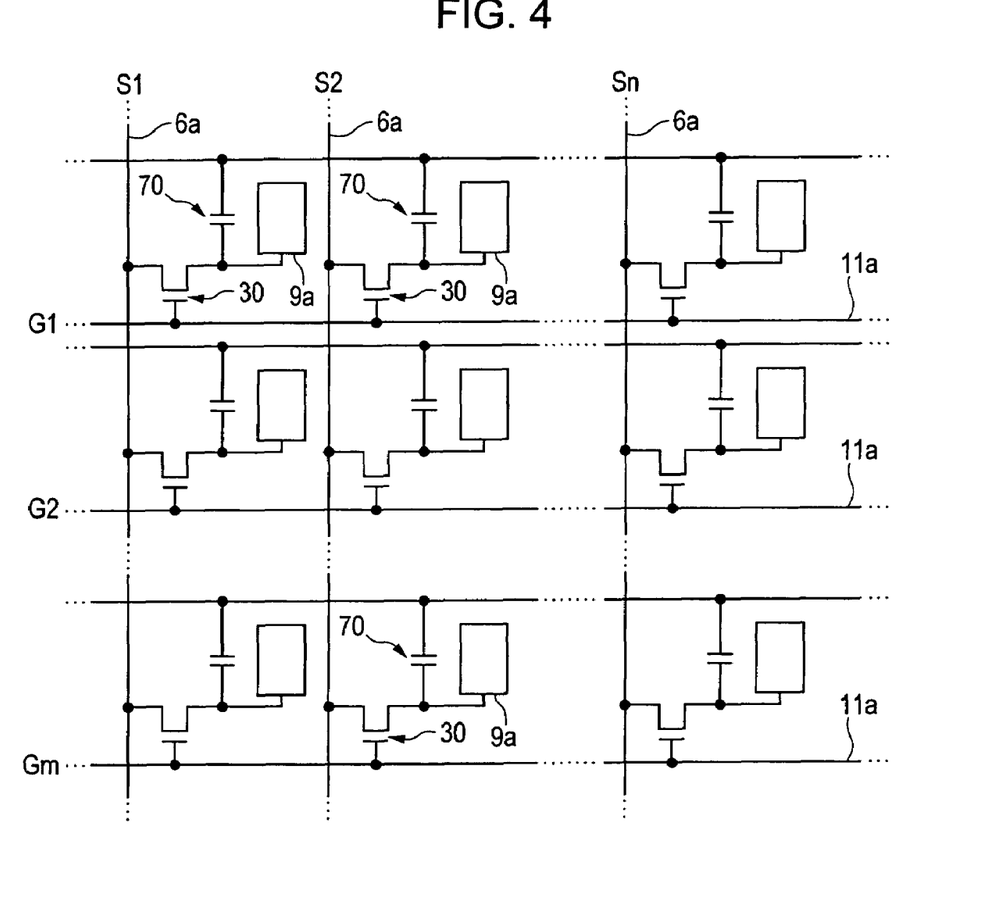
FIG. 4 is an equivalent circuit diagram of various elements, wiring lines, and so on in a plurality of pixels which constitutes pixel regions of FIGS. 1 and 2.
Figure 5:
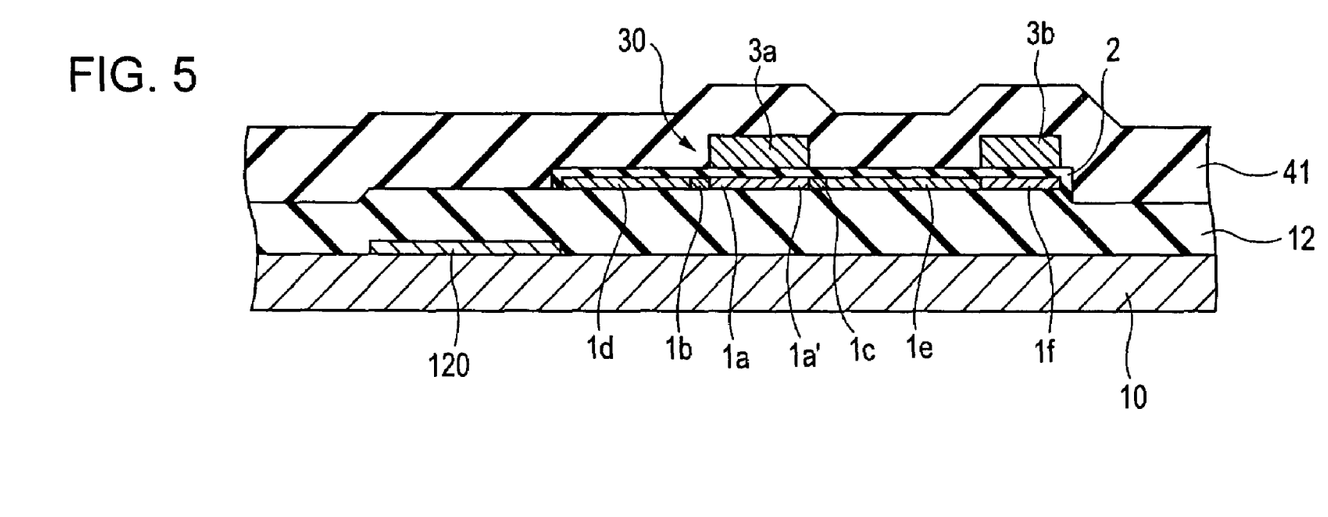
FIG. 5 is a cross-sectional view schematically showing a substrate for a liquid crystal device of FIGS. 1 and 2.
Figure 6:
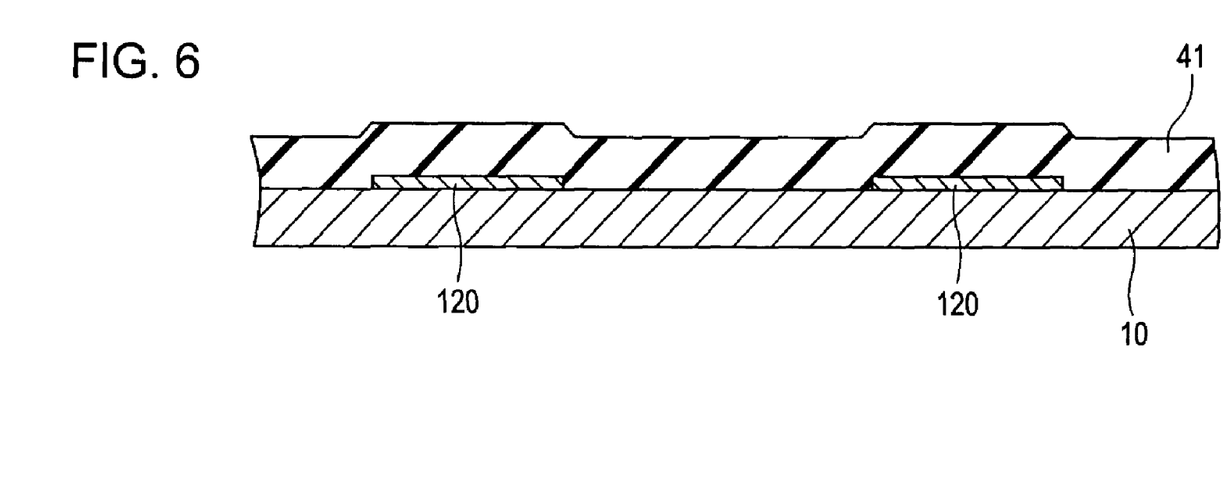
FIG. 6 is a cross-sectional view schematically showing a substrate for a liquid crystal device.
Figure 7:
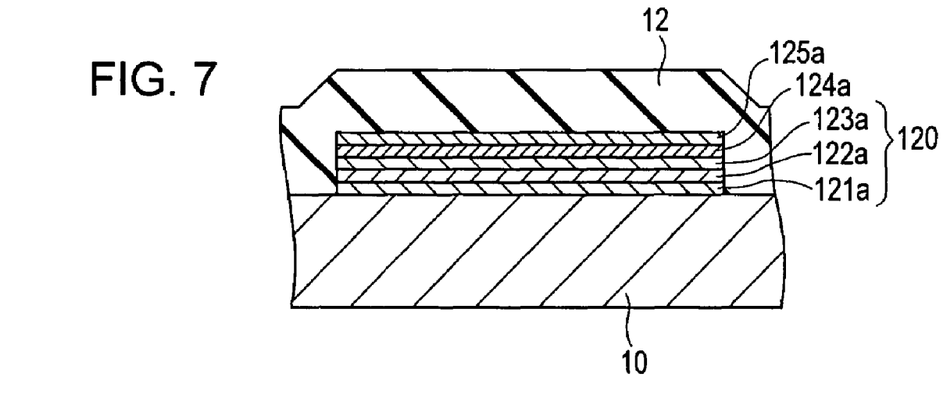
FIG. 7 is an exploded cross-sectional view of a light-shielding film.
Figure 8:
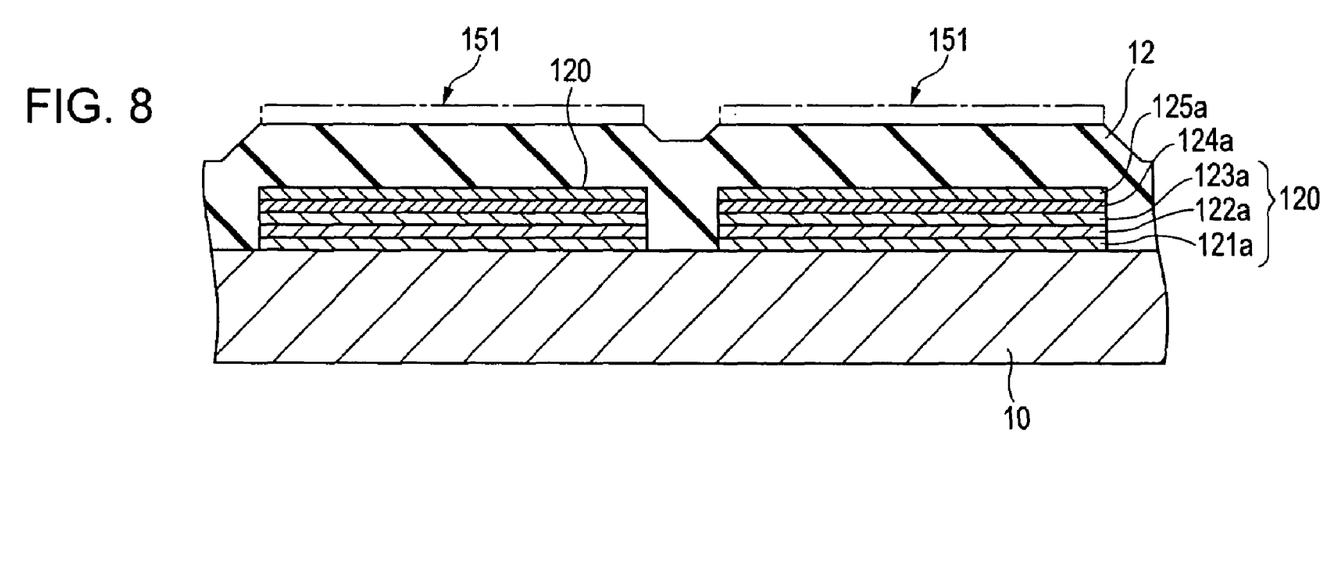
FIG. 8 is a cross-sectional view schematically showing a switch circuit portion.
Figure 9:
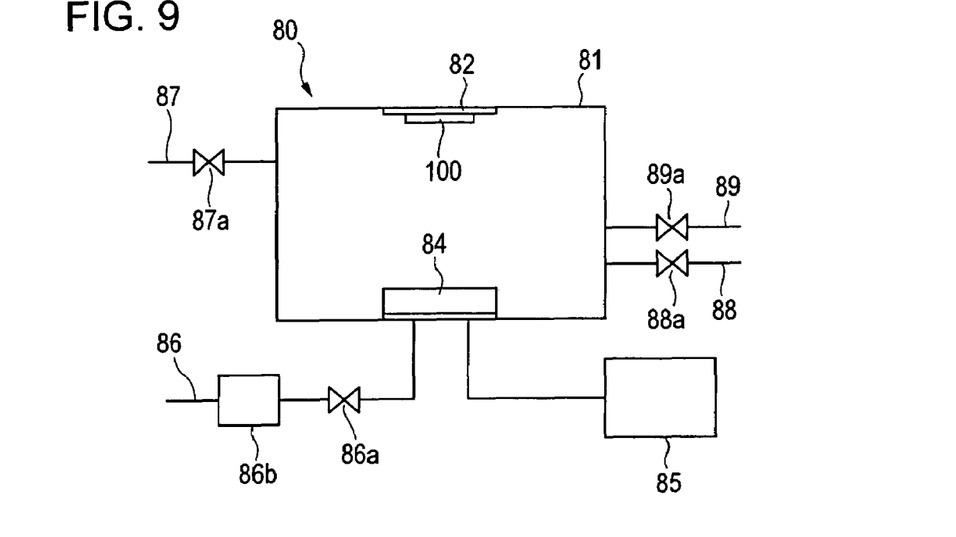
FIG. 9 is a diagram schematically showing a configuration of a sputtering apparatus.
Figure 10A:
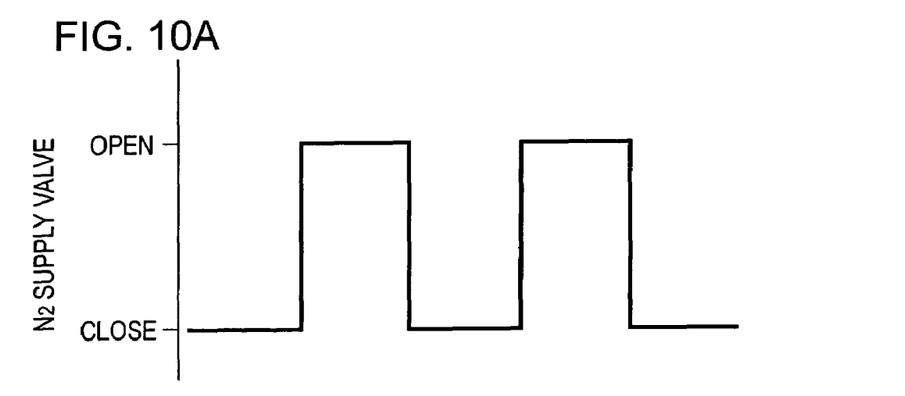
FIG. 10A is a timing chart showing an ON/OFF control timing of a reactive gas control valve.
Figure 10B:
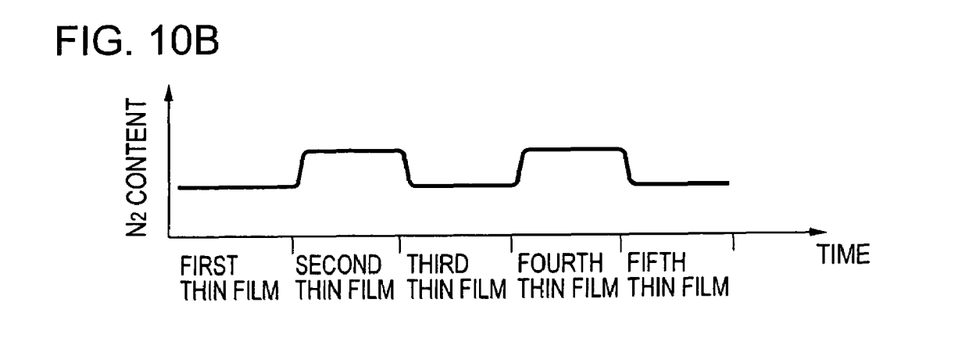
FIG. 10B is a diagram illustrating a change in $N_2$ content.
Figure 11:
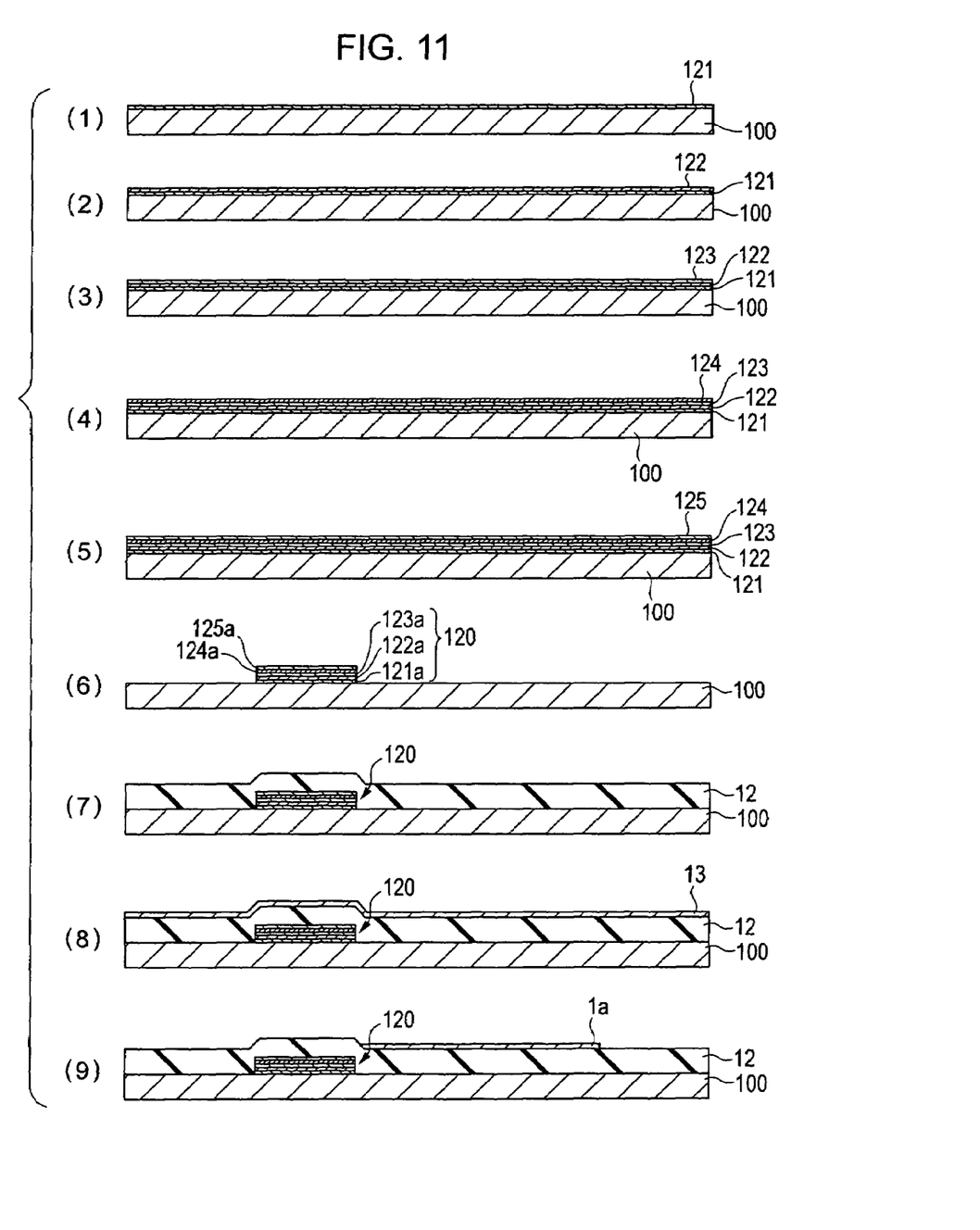
FIG. 11 is a cross-sectional view sequentially showing a manufacturing method of a substrate for a liquid crystal device.

Hereinafter, an embodiment of the present invention will be described with reference to the drawings. FIG. 1 is a plan view a liquid crystal device, which is an electro-optical device configured by using a substrate for a liquid crystal device, and various element formed thereon as viewed from a counter substrate, FIG. 2 is a cross-sectional view of a liquid crystal device taken along line II-II of FIG. 1 after an assemblage step in which an element substrate and a counter substrate are bonded and liquid crystal is sealed is completed, FIG. 3 is a block diagram showing an electrical configuration of a liquid crystal device, and FIG. 4 is an equivalent circuit diagram of various elements, wiring lines, and so on in a plurality of pixels which constitutes pixel regions of FIGS. 1 and 2. Further, FIG. 5 is a cross-sectional view schematically showing a substrate for a liquid crystal device of FIGS. 1 and 2, FIG. 6 is a cross-sectional view schematically showing a substrate for a liquid crystal device, FIG. 7 is an exploded cross-sectional view of a light-shielding film, and FIG. 8 is a cross-sectional view schematically showing a switch circuit portion. In addition, FIG. 9 is a diagram schematically showing a configuration of a sputtering apparatus, FIG. 10A is a timing chart showing an ON/OFF control timing of a reactive gas control valve, FIG. 10B is a diagram illustrating a change in $N_2$ content, and FIG. 11 is a cross-sectional view sequentially showing a manufacturing method of a substrate for a liquid crystal device.

An entire configuration of a liquid crystal device will be described with reference to FIGS. 1 to 4. A liquid crystal device which is an example of an electro-optical device has a TFT substrate 10 made of, for example, a quartz substrate or a glass substrate, and a counter substrate 20, made of, for example, a glass substrate or a quartz substrate, which faces the TFT substrate 10, with liquid crystal 50 held therebetween. The facing TFT substrate 10 and counter substrate 20 are bonded to each other a sealing material 52.

On the TFT substrate 10, pixel electrodes (ITO) 9a constituting pixels or the like are arranged in a matrix shape. Moreover, on an entire surface of the counter substrate 20, a counter electrode (ITO) 21 is provided. On the pixel electrodes 9a of the TFT substrate 10, an alignment film 16 suffered from a rubbing treatment is provided. On the other hand, on the counter electrode 21 which is formed on the entire surface of the counter substrate 20, an alignment film 22 suffered from the rubbing treatment is provided. The alignment films 16 and 22 are respectively made of a transparent organic film such as polyimide.

FIG. 3 shows an electrical configuration of the liquid crystal device. The liquid crystal device has a scanning line driving circuit 401 and a data line driving circuit 500. The scanning line driving circuit 401 is referred to as a so-called Y shift register, which transmits a start pulse DY to be supplied at a beginning of a subfield in accordance with a clock signal CLY, such that scanning signal G1, G2, G3, . . . , Gm are sequentially supplied to scanning lines 11a respectively.

Moreover, the data line driving circuit 500 sequentially latches n driving data signals Ds corresponding to the number of data lines 6a in one horizontal scanning period and simultaneously supplies data signals S1, S2, S3, . . . , Sn, each having a voltage level to be determined by a relationship between latched data and an alternating current (AC) signal FR, to the corresponding data lines 6a in next horizontal scanning period.

FIG. 4 shows an equivalent circuit of elements constituting the pixels on the TFT substrate 10. In a pixel region, a plurality of scanning lines 11a and a plurality of data lines 6a are arranged to intersect each other, and the pixel electrodes 9a are arranged in a matrix shape in regions divided by the scanning lines 11a and the data lines 6a. And then, thin film transistors (hereinafter, referred to as 'TFTs') 30 are provided in correspondence with intersections of the scanning lines 11a and the data lines 6a and the pixel electrodes 9a are connected to the TFTs 30 respectively.

The TFT 30 is turned on by an ON signal from the scanning line 11a, such that an image signal, which is supplied to the data line 6a, is supplied to the pixel electrode 9a. A voltage between the pixel electrode 9a and the counter electrode 21 provided on the counter substrate 20 is applied to the liquid crystal 50.

Moreover, a storage capacitor 70 is provided parallel to the pixel electrode 9a, such that the voltage of the pixel electrode 9a can be maintained for a period of time, for example, three digits longer than the time of the application of a source voltage, by the storage capacitor 70. By the storage capacitor 70, the voltage maintaining property is enhance, and thus image display can be realized in a high contrast ratio.

FIG. 5 is a schematic cross-sectional view of the liquid crystal device paying attention to one pixel, and FIG. 6 is a schematic cross-sectional view of other positions. On the TFT substrate 10, in addition to the TFTs 30 or the pixel electrodes 9a, various elements are provided in a laminated structure. The laminated structure includes a first layer having the scanning lines 11a, and a second layer including the TFTs 30 or the like in a sequence from the bottom. In addition, though not shown, a third layer including the storage capacitors 70, a fourth layer including the data lines 6a or the like, a fifth layer including a shield layer or the like, and a sixth layer including the pixel electrodes 9a, the alignment film 16 or the like are provided.

Further, a base insulating film 12 and an interlayer insulating film 41 as an insulating film are provided between the first layer and the second layer and between the second layer and third layer, respectively. Moreover, though not shown, interlayer insulating films are provided between the respective layers of the third to sixth layers. The respective insulating films 12, 41, . . . are made of NSG (non-doped silicate glass) films, and by the respective insulating films 12, 41, . . . , short circuits among the elements provided on the respective layers are prevented from occurring. In addition, in various kinds of the insulating films 12, 41, . . . , for example, contact holes to electrically connect the data lines 6a and heavily doped source regions 1d in semiconductor layers 1a of the TFTs 30 are provided.

Further, on positions of the first layer corresponding to the respective TFTs 30, light-shielding films 120 are provided. The light-shielding film 120 is intended to prevent light reflected by the TFT substrate 10 from being incident on a channel region of the TFT 30 or channel adjacent regions.

Further, the TFTs 30 including gate electrodes 3a are provided on the second layer. As shown in FIG. 5, the TFT 30 has a lightly doped drain (LDD) structure. The LDD structure includes the above-mentioned gate electrode 3a, the channel region 1a' of the semiconductor layer 1a made of a polysilicon film where a channel are formed by an electric field from the gate electrode 3a, an insulating film 2 having a gate insulating film which insulates the gate electrode 3a from the semiconductor layer 1a, and a lightly doped source region 1b, a lightly doped drain region 1c, a heavily doped source region 1d, and a heavily doped drain region 1e in the semiconductor layer 1a. Moreover, a reference numeral 1f denotes a storage capacitor electrode.

Further, when the light-shielding films 120 are arranged corresponding to the TFT 30, as shown in FIG. 6, the light-shielding films 120 may be arranged adjacent to each other.

As shown in FIG. 7, the respective light-shielding films 120 have multilayered thin film structure (in the present embodiment, five-layered thin film structure). As regards the respective layers, the first thin film 121a, the third thin film 123a, and the fifth thin film 125a are made of a metal silicide such as WSi (tungsten silicide), and the second thin film 122a and the fourth thin film 124a are made of a metal silicide nitride to which nitrogen ($N_2$) is added as an additive. Moreover, in addition to nitrogen, nitrogen-based compound may be used as the additive.

Further, the total film thickness of the respective thin films 121a to 125a is set to have the same thickness as that of the conventional light-shielding film (for example, 100 nm). As a material of the metal silicide, a high melting point metal material or a high melting point metal compound including at least one of titanium (Ti), chromium (Cr), tungsten (W), tantalum (Ta), molybdenum (Mo), nickel (Ni), cobalt (Co) and lead (Pb), which are non-transparent high melting point metal material, is adopted.

Moreover, the light-shielding film 120 is film-formed by a sputtering method with tungsten (W) or silicon (Si), which is a raw material of the metal silicide, as a target. And then, at the time of film-forming, a nitrogen gas as a reactive gas is intermittently introduced into a sputtering apparatus at a predetermined interval to perform reactive sputtering, such that the metal silicide and metal silicide nitride are alternately film-formed to form the light-shielding film 120 having the multilayered thin film structure. Moreover, since the nitrogen gas is intermittently supplied during sputtering, interfaces between the respective thin films 121a, 123a and 125a and the respective thin films 122a and 124a film-formed between the thin films 121a, 123a and 125a are clearly distinguished from each other, and also the addition amount of nitrogen in a vicinity of each of the interfaces gradually changes (see FIG. 10B). Further, as the reactive gas, other than the nitrogen gas, a gas containing nitrogen or a gas containing a nitrogen compound may be used.

Further, in the present embodiment, in addition to the light-shielding films 120 which are arranged corresponding to the TFT 30, the light-shielding films 120 which are arranged in other portions also have a five-layered thin film structure. For example, FIG. 8 shows sampling switches 151 which are provided in the data lines respectively. The function of the sampling switch 151 will be simply described. The sampling switches 151 are transistor switches which sample the image signals, which are supplied to wiring lines via image signal lines, in accordance with sampling signals which are supplied from the data line driving circuit, and supply the sampled image signals to the corresponding data lines. The sampling switches 151 are provided on the base insulating film 12. Further, gate electrodes of the sampling switches 151 are connected to the wiring lines to which the image signals are supplied from a plurality of image signal lines, such that the image signals which are supplied from the plurality of image signal lines are simultaneously supplied to the plurality of data lines.

Further, the wiring lines to which the image signals are supplied are connected to source regions of the semiconductor layers of the sampling switches 151, and the data lines are connected to drain regions of the semiconductor layers of the sampling switches 151. On the first layer of the TFT substrate 10 corresponding to the sampling switches 151, the light-shielding films 120 are provided. Moreover, referring to FIG. 8, edge portions of the sampling switches 151 correspond to edge portions of the light-shielding films 120. The light-shielding films 120 are respectively formed in an island shape for the sampling switches 151. Thus, a crack due to internal stress of the light-shielding film can be prevented from occurring. Moreover, the light-shielding films 120 are not limited to be respectively provided for the respective sampling switch 151. Instead, an island-shaped light-shielding film which overlaps a region corresponding to a plurality of sampling switches 151 may be provided.

Next, a configuration of the sputtering apparatus 80 which performs the sputtering method for film-forming the light-shielding films 120 will be described simply with reference to FIG. 9.

The sputtering apparatus 80 has a vacuum chamber 81, and on one side within the vacuum chamber 81, a substrate holder 82 which holds a large substrate 100 prior to cutting the TFT substrates 10 is arranged. Further, on an opposite side to the substrate holder 82, a target section 84 is arranged.

Moreover, hereinafter, it is assumed that tungsten (W) and silicon (Si) which forms WSi (tungsten silicide) as metal silicide are sputtered such that the light-shielding film 120 is made. Therefore, as a target material which is provided on the target section 84, a sintered body in which tungsten (W) and silicon (Si) are mixed in a predetermined mole ratio (for example, W:Si=1:2.7) is used.

Further, a reference numeral 85 denotes a power supply for applying a power, a reference numeral 86 denotes a cooling water system, a reference numeral 87 denotes a vacuum exhaust system, and reference numerals 88 and 89 denote an inert gas supply system into the chamber and a reactive gas supply system respectively. In addition, the respective systems 87, 88 and 89 are provided with control valves 87a, 88a and 89a, respectively. Moreover, the flow or pressure within the cooling water system 86 is adjusted by controlling the degree of opening of an electromagnetic valve 86a. Further, the water temperature within the cooling water system 86 is controlled by a temperature controller 86b.

An argon (Ar) gas as an inert gas is supplied from the inert gas supply system 88, and the nitrogen ($N_2$) gas as the reactive gas is supplied from the reactive gas supply system 89. Moreover, as sputtering conditions, the power is set from 2.5 to 3 Kw, the pressure of the argon gas is set from 0.1 to 0.3 Pa, the temperature within the vacuum chamber is from the room temperature to 400° C., and the flow is set to Ar:$N_2$=200:60 (sccm).

Further, FIG. 10A shows a valve opening and closing timing of the reactive gas control valve 89a. As shown in FIG. 10A, as regards the film-formations of the first thin film 121, the third thin film 123, and the fifth thin film 125, the reactive gas control valve 89a is closed to stop the supply of the nitrogen gas. On the other hand, when the second thin film 122 and the fourth thin film 124 are film-formed, the control valve 89a is opened to supply the nitrogen gas into the vacuum chamber 81, such that the reactive sputtering is performed.

(Manufacturing Process)

Next, a forming process of the light-shielding film 120 will be described with reference to FIG. 11. First, the large substrate 100, made of a quartz substrate or a glass substrate, prior to cutting the TFT substrates 10, is prepared. Here, an annealing treatment is preferably performed at a high temperature of 900 to 1300° C. under an inert gas atmosphere of N (nitrogen). Specifically, a pre-treatment is performed such that distortion in the large substrate 100 is reduced in subsequent high temperature treatments.

Subsequently, a thin film as a base of the light-shielding film 120 is deposited on a predetermined portion of the large substrate 100, and then the large substrate 100 is loaded on the substrate holder 82 which is provided in the vacuum chamber 81 of the sputtering apparatus 80. Moreover, as the thin film constituting the base of the light-shielding film 120, in addition to quartz or silicon, various films such as an oxide film ($SiO_2$) which forms the interlayer insulating film, a polysilicon film which forms the gate electrode or the like, and so on may be used.

And then, the sputtering starts. Moreover, as the sputtering conditions, as described above, the power is set from 2.5 to 3 Kw, the pressure of the argon gas is set from 0.1 to 0.3 Pa, the temperature within the vacuum chamber is set from the room temperature to 400° C., an the flow is set to $Ar:N_2=200:60$ (sccm).

Step (1): First, the first thin film 121 is formed on the large substrate 100. The argon gas is introduced into the vacuum chamber 81, such that plasmas are caused in a surface of the target material which is arranged on the target section 84. With ionized gas molecules in the plasmas caused by the discharge, sputter particles made of tungsten (W) and silicon (Si) are driven from the surface of the target material. And then the driven sputter particles are attached to the large substrate 100 which opposes the target material, such that the first thin film 121 is film-formed.

In this case, since the reactive gas control valve 89a is closed, the nitrogen gas is not supplied into the vacuum chamber 81, as shown in FIG. 10A. Therefore, the first thin film 121 is made of a compound of tungsten (W) and silicon (Si).

Step (2): The second thin film 122 is film-formed on the first thin film 121. As shown in FIG. 10A, when the second thin film 122 is film-formed, the reactive gas control valve 89a is opened, and thus the nitrogen gas is supplied into the vacuum chamber 81. If so, the $N_2$ gas as the reactive gas is mixed in the Ar gas atmosphere of the vacuum chamber 81, and then the $N_2$ gas compounds with and reacts to the compound of tungsten (W) and silicon (Si), such that a nitride film is generated.

Step (3): The third thin film 123 is film-formed on the second thin film 122. As shown in FIG. 10A, when the third thin film 123 is film-formed, the reactive gas control valve 89a is closed to stop the supply of the nitrogen gas into the vacuum chamber 81. If so, the amount of the $N_2$ gas in the Ar gas atmosphere of the vacuum chamber 81 is reduced. Therefore, the third thin film 123 is made of the compound of tungsten (W) and silicon (Si).

Step (4): The fourth thin film 124 is film-formed on the third thin film 123. As shown in FIG. 10A, when the fourth thin film 124 is film-formed, the reactive gas control valve 89a is opened again, and thus the nitrogen gas is supplied into the vacuum chamber 81, such that the reactive sputtering is performed. As a result, the fourth thin film 124 is made of a nitride film, similarly to the second thin film 122, in which the $N_2$ gas compounds with and reacts to the compound of tungsten (W) and silicon (Si).

Step (5): The fifth thin film 125 is film-formed on the fourth thin film 124. As shown in FIG. 10A, when the fifth thin film 125 is film-formed, the reactive gas control valve 89a is closed again to stop the supply of the nitrogen gas into the vacuum chamber 81. Therefore, similarly to the third thin film 123, the fifth thin film 125 is made of the compound of tungsten (W) and silicon (Si).

Moreover, the respective thin films 121 to 125 which are film-formed by the sputtering method are in an amorphous state that most of them are not silicidized.

Step (6): On the fifth thin film 125 as an uppermost layer which is formed in the step (5), a resist mask corresponding to the pattern of the light-shielding film 120 is formed by a photolithography, and the respective thin films 121 to 125 are etched through the resist mask, such that the light-shielding film 120 having the five-layered structure is formed.

Step (7): On the light-shielding film 120, the base insulating film 12 made of $SiO_2$ as the NSG is formed with a TEOS (tetraethyl orthosilicate) gas by an atmospheric or a reduced-pressure CVD method.

And then, after forming the NSG, the large substrate 100 is inserted into a furnace which is already heated to 600 to 900° C., and then the annealing treatment is performed. As a result, the first, third and fifth thin films 121, 123 and 125 become WSi films, and the second and fourth thin films 122 and 124 become WSiN (tungsten silicide nitride) films. When the respective thin films 121 to 125 are silicidized, stresses due to thermal distortions occur in the first, third and fifth thin films 121, 123 and 125. Meanwhile, since the second and fourth thin films 122 and 124 interposed between the first, third and fifth thin films 121, 123 and 125 contain nitrogen, the second and fourth thin films 122 and 124 can be thermally expanded or contracted. By the thermal expansion or contraction of the second and fourth thin films 122 and 124, the stresses generated in the first, third and fifth thin films 121, 123 and 125 are absorbed.

On the other hand, when the sputtering is performed using the target material having the mole ratio of W:Si=1:2.7, tungsten silicide is stable in a state of $WSi_2$ and thus has a polycrystalline structure of $WSi_2$ by the annealing treatment after the film-formation. However, since a surplus Si of the mole ratio of 0.7 remains in the film, the film of $WSi_2$ in which island-shaped silicon is scattered is obtained.

Further, when the light-shielding film contacts a Si-based material such as $SiO_2$ or SiN (the substrate or the insulating film), in its interface, surplus island-shaped silicon is absorbed from the interface outside the light-shielding film. That is, since single silicon is absorbed in silicon-based compound material, there is a phenomenon that the compound tends to be more stable. Thus, after island-shaped silicon is removed, voids are scattered, and thus a stress in a direction where the voids are dissolved, that is, contraction stress acts on tungsten silicide.

In the present embodiment, there is also provided mechanism in which Si is previously nitrided, and a thin film in which islands of single silicon do not exist is interposed within the light-shielding film, such that the above-mentioned phenomenon is suppressed from occurring.

Therefore, after the annealing treatment, the crack in the base insulating film 12 does not occur, and thus a product yield can be improved.

Moreover, the total film thickness of the thin films 121 to 125 is the same as that of the conventional light-shielding film, and thus light-shielding property is prevented from damaging. Further, there is no case in which stepped portions with respect to other films are caused.

Further, the addition ratios of nitrogen to the second and fourth thin films 122 and 124 can be varied, and thus the stress generated with respect to the base insulating film 12 can be further reduced.

Step (8): On the base insulating film 12, an amorphous silicon film is film-formed under a relatively low temperature of about 450 to 550° C., preferably about 500° C., by the reduced-pressure CVD method which uses a monosilane gas or a disilane gas. Subsequently, an annealing treatment is performed under a nitrogen atmosphere, and thus the silicon film 133 is grown in a solid-phase.

Step (9): The polysilicon film 133 is patterned in a predetermined pattern by a photolithography step, an etching step, and so on, such that the semiconductor layer 1a is formed.

Subsequently, the storage capacitor electrode 1f, together with the semiconductor layer 1a constituting the TFT 30, is suffered from a thermal oxidization, such that a thermally oxidized silicon film is formed. In addition, a high temperature silicon oxide film (HTO film) or silicon nitride film is deposited by the reduced-pressure CVD method, such that the insulating film 2 including the gate insulating film of the TFT 30 is formed. Moreover, the subsequent manufacturing steps are the same as those in the conventional manufacturing process, and thus the descriptions thereof will be omitted.

As such, in the present embodiment, the light-shielding film 120 has the multilayered (five-layered) structure, and the second thin film 122 and the fourth thin film 124 are made of the WSiN films. Thus, even when the respective thin films 121 to 125 are silicidized at the time of the annealing treatment, the stresses generated in the first, third and fifth thin films 121, 123 and 125 are absorbed by the thermal expansion or contraction of the second thin film 122 and the fourth thin film 124. Therefore, the cracks in the respective insulating films and the semiconductor layer are prevented from occurring. As a result, the product yield can be improved. Besides, the addition ratios of nitrogen to the second thin film 122 and the fourth thin film 124 can be varied, and thus the thermal distortion can be further prevented from occurring.

Further, the nitrogen gas is intermittently supplied when the sputtering is performed at one time such that the light-shielding film 120 has the multilayered structure, and thus the number of the steps required for the film-formation does not increase. The rising of the manufacturing cost can be suppressed.

Moreover, in the above-mentioned embodiment, the lowermost thin film 121a and the uppermost thin film 125a in the light-shielding film 120 may be electrically connected to each other via a contact hole. Further, the light-shielding film 120 is not limited to the five-layered thin film structure. Instead, the multi-layered thin film structure of three layers or six or more layers may be adopted. In this case, nitrogen is added to odd-numbered or even-numbered films. Further, if nitrogen is added to the thin film, a resistance value increases. Thus, when the light-shielding film 120 and other wiring lines are needed to contact with each other, the lowermost layer or uppermost layer to be contacted is made of the WSi film. Therefore, when the contact is not needed, the lowermost layer or uppermost layer may be made of the WSiN film.

Further, in the present embodiment, the semiconductor layer 1a which is formed above the light-shielding film 120 is exemplified. However, the present invention is not limited to this structure. For example, the light-shielding film having the multilayered thin film structure may be formed above the TFT 30 to cover the TFT 30.

Further, the electro-optical device of the present invention is not limited to the liquid crystal device. Instead, an electroluminescent (EL) device or an electrophoretic device may be used. Further, various electronic apparatuses, such as a projection type display device, a liquid crystal television, a cellular phone, an electronic organizer, a word processor, a view finder type or monitor-direct-view type video tape recorder, a workstation, a videophone, a POS terminal, a touch panel, which have the above-mentioned electro-optical device and are capable of realizing high quality image display, may be used.

What is claimed is:

1. An electro-optical device comprising:
   a substrate; and
   a light-shielding film formed above the substrate, the light-shielding film having a multilayered thin film structure, including:
      a first silicide thin film containing an additional material;
      a second silicide thin film formed directly on the first silicide film, the second silicide thin film not containing the additional material;
      a third silicide thin film formed directly on the second silicide film, the third silicide thin film containing the additional material; and
      a fourth silicide thin film formed directly on the third silicide film, the fourth silicide thin film not containing the additional material.

2. The electro-optical device according to claim 1, wherein a thin film formed as a lowermost layer of the light-shielding film is made of the silicide thin film not containing the additional material.

3. The electro-optical device according to claim 1, wherein a thin film formed as a lowermost layer of the light-shielding film is made of the silicide thin film containing the additional material.

4. The electro-optical device according to claim 1, wherein a thin film formed as an uppermost layer of the light-shielding film is made of the silicide thin film not containing the additional material.

5. The electro-optical device according to claim 1, wherein a thin film formed as an uppermost layer of the light-shielding film is made of the silicide thin film containing the additional material.

6. The electro-optical device according to claim 1, wherein the additional material is made of at least one of nitrogen and a nitrogen-based compound.

7. The electro-optical device according to claim 1, further comprising:
   a semiconductor layer deposited on the light-shielding film with an insulating film interposed therebetween.

8. The electro-optical device according to claim 1, further comprising:
   a thin film transistor formed on the substrate,
   wherein the light-shielding film is formed above the thin film transistor so as to cover at least the thin film transistor.

9. An electronic apparatus comprising an electro-optical device as claimed in claim 1.

* * * * *